US009520290B1

United States Patent
Ma et al.

(10) Patent No.: US 9,520,290 B1
(45) Date of Patent: Dec. 13, 2016

(54) ION IMPLANTATION FOR IMPROVED ETCH PERFORMANCE

(71) Applicant: Varian Semiconductor Equipment Associates, Inc., Gloucester, MA (US)

(72) Inventors: Tristan Y. Ma, Lexington, MA (US); Maureen K. Petterson, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/832,080

(22) Filed: Aug. 21, 2015

(51) Int. Cl.
*H01L 21/425* (2006.01)
*H01L 21/027* (2006.01)
*H01L 21/225* (2006.01)

(52) U.S. Cl.
CPC ....... *H01L 21/0276* (2013.01); *H01L 21/2253* (2013.01); *H01L 21/2254* (2013.01)

(58) Field of Classification Search
CPC ............. H01L 21/0332; H01L 21/0334; H01L 21/0335; H01L 21/0337; H01L 21/0338
See application file for complete search history.

(56) References Cited

U.S. PATENT DOCUMENTS

| 7,786,017 B1 * | 8/2010 | Morgenfeld | H01L 21/31116 257/E21.246 |
| 2006/0051965 A1 * | 3/2006 | Edelberg | G03F 7/40 438/706 |
| 2008/0081382 A1 * | 4/2008 | Yang | H01L 21/2652 438/14 |
| 2011/0177650 A1 * | 7/2011 | Qian | H01L 21/26586 438/75 |
| 2014/0242523 A1 | 8/2014 | Godet et al. | |

FOREIGN PATENT DOCUMENTS

CN  102096310 A  *  6/2011

OTHER PUBLICATIONS

Tristan Y. MA, Multiple Exposure Treatment for Processing a Patterning Feature, U.S. Appl. No. 14/645,646, filed Mar. 12, 2015.

* cited by examiner

*Primary Examiner* — Zandra Smith
*Assistant Examiner* — Evan Clinton (57) ABSTRACT

Provided herein are approaches for patterning a semiconductor device. In an exemplary approach, a method includes providing a set of patterning features atop a layer of a semiconductor device, and implanting ions into a sidewall surface of the set of patterning features. The method includes implanting ions at an angle nonparallel with the sidewall surface, for example, approximately 60° to a plane normal to the sidewall surface. The method further includes etching the semiconductor device after the ions are implanted into the sidewall surface. As a result, by using an angled ion implantation as a pretreatment prior to etching, photoresist roughness is minimized, and sidewall striation and etch-induced line edge roughness is reduced. Approaches herein may also improve etch selectivity with respect to underlying layers disposed under the photoresist, as well as improved photoresist profiles.

19 Claims, 5 Drawing Sheets

ION IMPLANTATION FOR IMPROVED ETCH PERFORMANCE

FIELD OF THE DISCLOSURE

The present embodiments relate to substrate patterning, and more particularly, to techniques for implanting patterning features with ions.

BACKGROUND OF THE DISCLOSURE

As semiconductor devices scale to smaller dimensions, a need has arisen to more accurately define and control the dimensions and shapes of photoresist (resist) features used to pattern substrates. Various techniques have been developed to treat photoresist features after the photoresist features are formed, but before the photoresist features are used to pattern a substrate. The treatment may be used, for example, to control the shape and roughness for photoresist features. Etch has been known to improve line edge roughness (LER) and/or line width roughness (LWR) during the patterning process, but there exists a limit to how much etch can improve LER/LWR.

SUMMARY OF THE DISCLOSURE

In view of the foregoing, approaches herein provide for angled ion implantation to aid the etch process to overcome the LER reduction limit and, in exemplary embodiments, to improve the etch selectivity of patterning materials. Moreover, approaches herein provide for implanting ions at an angle to prevent and remove the formation of nano-scale hard masks in organic and/or inorganic materials, and to work in combination with plasma etch processes to further improve LER/LWR.

An exemplary method in accordance with the present disclosure may include providing a set of patterning features atop a layer of a semiconductor device, implanting ions into a sidewall surface of the set of patterning features, wherein the ions are implanted at an angle nonparallel with the sidewall surface. The method further includes etching the semiconductor device after the ions are implanted into the sidewall surface.

Another exemplary method in accordance with the present disclosure, may include providing a set of patterning features atop an anti-reflective coating (ARC) layer of a semiconductor device, the set of patterning features formed from a photoresist. The method further includes implanting ions into a sidewall surface of the set of patterning features at an angle of approximately 60° relative to a plane normal to the sidewall surface to form a treated layer along the set of patterning features, and etching the ARC layer after the ions are implanted into the sidewall surface.

Another exemplary method in accordance with the present disclosure may include providing a set of patterning features atop a layer of a semiconductor device, the layer formed atop a second layer, and performing a first ion implant to a sidewall surface of the set of patterning features at an angle of approximately 60° relative to a plane normal to the sidewall surface to form a first treated layer along the set of patterning features. The method further includes etching the semiconductor device to recess the set of patterning features and the layer, and performing a second ion implant to the sidewall surface of the set of patterning features at an angle of approximately 60° relative to the plane normal to the sidewall surface to form a second treated layer along the set of patterning features. The method further includes etching the semiconductor device to remove the set of patterning features and to recess the layer selective to the second layer.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, provided herein are approaches for patterning a semiconductor device. In an exemplary approach, a method includes providing a set of patterning features atop a layer of a semiconductor device, and implanting ions into a sidewall surface of the set of patterning features. The method further includes implanting ions at an angle nonparallel with the sidewall surface, for example, 30 degrees relative to the sidewall surface. The method further includes etching the semiconductor device after the ions are implanted into the sidewall. As a result, by using an angled ion implantation as a pretreatment prior to etching, photoresist roughness is minimized, and sidewall striation and etch-induced line edge roughness is reduced.

More specifically, the embodiments described herein provide techniques for processing a patterning feature, such as a photoresist feature using multiple exposures of energetic species including ions, electrons, and vacuum UV radiation. The term "patterning feature" as used herein, refers to features such as photoresist, patterned organic or inorganic underlayers including anti-reflective coatings (ARC), bottom anti-reflective coatings (BARC), or other features used to transfer a pattern into one or more layers of a substrate. Various embodiments provide various advantages over known techniques used to process photoresists. For example, when ion implantation is used to treat a photoresist feature, line edge roughness (LER) or line width roughness (LWR) may be improved in some instances. LER and LWR as used herein refers to variation along an edge of a photoresist line or in line width of a photoresist feature, for example, along a length of the photoresist feature as viewed in a plan view.

The embodiments of the present disclosure provide advantages including the ability to tailor the photoresist profile by directing an angled exposure to a photoresist feature, wherein the exposure may constitute implantation of ions or exposure to high energy electromagnetic radiation, for example. The angled exposure may result in improved photoresist profiles, and may additionally improve line edge roughness. By providing the angled exposure, the LER/LWR in a photoresist feature may be improved, including in the low frequency range, for example, relatively longer scale variations along a photoresist line. The present embodiments may also provide improved etch selectivity with respect to an underlying layer disposed under a photoresist layer or photoresist feature, as well as improved photoresist profiles with respect to known post-lithography treatment of photoresists.

Embodiments herein may be especially advantageous for treating photoresist features having a critical dimension (CD) of 100 nm or less. In such photoresist features, LWR and LER may cause large and undesirable variations in CD within features within a substrate after etching of the substrate when the photoresist feature is in place. As noted, although conventional ion implantation may improve LER/LWR, the penetrated photoresist end cross-sectional profiles may be degraded some amount depending on species, dose, and energy incident on the photoresist feature, generating an undesirable profile to the photoresist feature. This may result in less than ideal etch behavior.

Figure 1A:
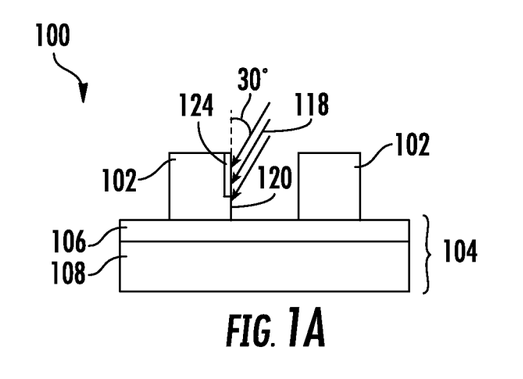
FIGS. 1A-1C depict side cross-sectional views of a method for patterning a semiconductor device in accordance with an embodiment of the present disclosure.
Figure 1B:
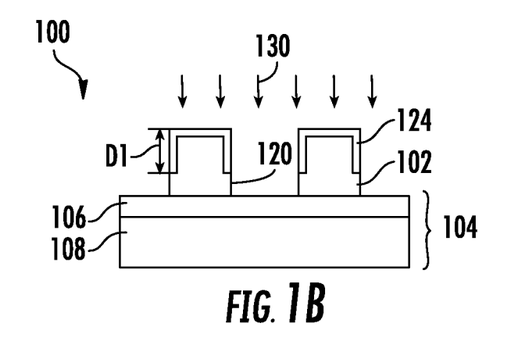
Figure 1C:
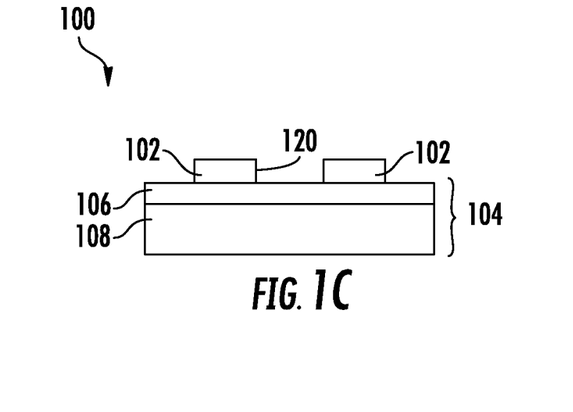

Turning now to FIGS. 1A-1C, there is shown cross-sectional views of an approach for patterning a device 100 according to various embodiments of the disclosure. In FIG. 1A, a set of patterning features 102 is disposed upon a substrate 104. In various embodiments the substrate 104 may include multiple layers including a layer 106 such as an antireflection coating (ARC) or a bottom antireflective coating (BARC), and a second layer 108 such as an organic planarization layer (OPL). The set of patterning features 102 may be formed from a photoresist.

In various embodiments, the set of patterning features 102 may form part of a larger pattern of features disposed on a silicon wafer or other substrate. Accordingly, the set of patterning features 102 may be characteristic of many other similar features disposed on the substrate 104, such as millions or billions of other similar features. In order to transfer an intended shape and size of a feature to the substrate 104 by etching the substrate 104, improvement of the LWR of the set of patterning features 102 while maintaining an acceptable sidewall profile before etching is advantageous.

As further shown in FIG. 1A, an ion implantation 118 to a sidewall surface 120 of one or more of the set of patterning features 102 is performed to form a treated layer 124 along the set of patterning features 102. In exemplary embodiments, the ion implantation 118 is performed at an angle nonparallel with the sidewall surface 120, for example, 30 degrees. As shown, ions are implanted at approximately 30° incidence angle to the sidewall surface 120 (or approximately 60° relative to a plane normal to the sidewall surface 120) to prevent the formation of nano-scale hardmasks in organic and inorganic materials. The implantation angle may vary in other embodiments by +/−15°. Furthermore, angled ion implantation 118 works in combination with a subsequent plasma etch process to further improve LER/LWR, as will be described in further detail below.

In various embodiments, one or multiple exposure process may be employed to generate the treated layer 124. In a one-exposure process, the set of patterning features 102 is processed by a first species penetrating each photoresist feature to a particular depth or thickness. In a multiple exposure process, the set of patterning features 102 may be processed by a first species in a first exposure at a first angled implant, and may be processed by a second species penetrating each photoresist feature to a particular depth or thickness. In various embodiments, the first species may be provided as first ions implanted to a first implantation depth, or deep implantation depth, and the second species may be provided as second ions implanted to a second implantation depth, or shallow implantation depth, less than the first implantation depth. Advantageously, for embodiments wherein the first species comprise first ions, the first ions may be implanted at a first implantation depth representing a larger fraction of the height of the photoresist feature. The embodiments are not limited in this context. The term "implantation depth," as used herein, may refer to the range $R_p$ of ions within the photoresist, as known in the art.

In particular embodiments, the ions of the ion implantation 118 may be selected from low-mass ions such as hydrogen ions, helium ions, carbon ions, boron ions, or nitrogen ions. Furthermore, the ion implantation energy and ion dose of the first ions may be selected to modify all or a portion of the set of patterning features 102, including generating chain scission within the photoresist feature, generating cross-linking in the photoresist feature, removing hydrogen atoms from the photoresist feature, altering the density of the photoresist feature, or other chemical and/or physical effects.

In particular embodiments, the ions provided in a second exposure may have a higher mass than the first ions. Exemplary second ions include inert gas ions, such as argon; silicon ions, or silicon-containing ions; and carbon. Other examples of second ions include krypton ions, xenon, ions, or germanium ions. The embodiments are not limited in this context. For example, in one embodiment, carbon may be used as first ions implanted at an energy of 20 keV, while carbon is also used as second ions implanted at 1 keV.

In other embodiments, the ion implantation 118 may constitute vacuum ultraviolet (VUV) radiation where the VUV radiation wavelength is less than 200 nm. The VUV radiation may be configured to penetrate to a depth representing a large fraction of the set of patterning features 102. In other embodiments, the ions of the ion implantation 118 may constitute electrons generated, for example, by a plasma also used as a source for ion implantation.

Advantageously, the ion implantation 118 may homogenize the treated layer 124 of the set of patterned features 102 and other underlying layer(s) to eliminate or reduce a chemical and mechanical gradient affecting the resist profile and etching properties. The ion implantation 118 may also minimize differences in mechanical properties in different portions of the set of patterned features 102 to form the treated layer 124 for example, by generating a density gradient between the bulk, or interior portion, and the shell, or outer portion, of the set of patterned features 102. In other embodiments, the treated layer 124 may include a highly densified shell surrounding the inner portion of the set of patterned features 102. In addition, the ion implantation 118 may facilitate polymer reorganization and reflow of the set of patterned features 102, and reduction in LER/LWR.

During operation, the ion implantation 118 may be performed while the device 100 is in a first position, for example as shown in FIG. 1A. Following formation of the treated layer 124 along the sidewall surface 120, the device 100 is rotated (e.g., 180 degrees), and the ion implantation 118 may further form the treated layer 124 along one or more additional surfaces of the set of patterning features 102, for example as shown in FIG. 1B. In exemplary embodiments, treated layer 124 is formed atop the set of patterned features 102, and partially along the sidewall surface 120 to a vertical depth D1, as shown. In some embodiments, the sidewall will be partially affected if there is shadowing from adjoining PR structure (e.g., for angled implant). Otherwise, the entire sidewall surface 120 may be implanted, for example, except in the case there is re-entrant profile in the starting PR.

In various embodiments, the ion implantation 118 may be provided to the set of patterning features 102 in a beamline ion implanter, a plasma doping tool (PLAD), a plasma tool having a plasma sheath modifier as known in the art, or other tool capable of providing ions. The embodiments of the disclosure are not limited in this context.

Dose of the ion implantation 118 is another factor dictating the extent of the desired effect. In one embodiment, in the case of the beamline ion implanter, the total dose of the implantation is divided into an even number of increments with the dose per increment in the order of $\sim 10^{14}$ to prevent resist lines from collapsing due to stress differences between the two sides of the same line. In various embodiments, the ion implantation 118 may comprise relatively lighter ions such as hydrogen or helium ions wherein an ion dose is provided over the range of 1E14-5E15 and at anion implantation energy of 1 keV-20 keV. In other embodiments, the ion implantation may comprises relatively heavier ions such as argon ions or silicon ions, wherein an ion dose is provided over a range of 5E15-3E16 and anion implantation energy of 0.5 keV-3 keV.

Additionally, an ion type of ion implantation 118 further dictates the extent of the desired effect. In various embodiments, the ions may come from a wide range of species such as H, He, Ar, C, N, Si, and Ge. The criteria for selecting one or more ion species to use may include the desired level of sputtering, the target ion penetration depth, and the improvement to etch selectivity. In one embodiment, $Ar^+$ ions are implanted at anion implantation energy of 250 eV.

As further shown in FIG. 1B, the device 100 is then etched using an etch process 130, for example a plasma etch, resulting in the structure of the device 100 shown in FIG. 1C. In exemplary embodiments, the set of patterning features 102 is recessed an amount approximately equal to D1 (FIG. 1B), and the layer 106 between the set of patterning features 102 is recessed selective to the second layer 108. As noted above, the layer 106 may correspond to an ARC and the second layer 108 to an OPL.

Embodiments herein may be applied to multiple stages within the patterning process, such as etching of the ARC and the OPL, as well as other inorganic hardmasks. Embodiments herein are not restricted to the photoresist level. Instead, whenever there is a need to etch pattern transfer into the next layer, the method demonstrated in FIGS. 1A-C may be used for improved patterning performance.

Figure 2A:
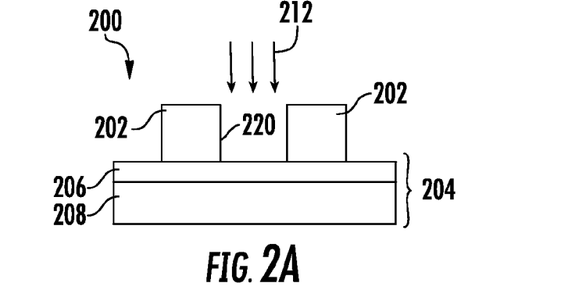
FIGS. 2A-2D depict side cross-sectional views of a method for patterning a semiconductor device in accordance with an embodiment of the present disclosure.

Turning now to FIGS. 2A-D there is shown cross-sectional views of an approach for patterning a device 200 according to various embodiments of the disclosure. As shown in FIG. 2A, a set of patterning features 202 is disposed upon a substrate 204. In various embodiments, the substrate 204 may include multiple layers including a layer 206 (e.g., ARC or BARC), and a second layer 208 (e.g., OPL). The set of patterning features 202 may be formed from a photoresist.

In this embodiment, a multiple implantation approach may be used, wherein a first ion implantation 212 is performed at a substantially vertical (e.g., incidence angle relative to a sidewall surface 220 of 0°) orientation to penetrate an entire depth of the layer 206 for the purpose of eliminating stress between the layer 206 and adjoining layers, for example, the set of patterning features 202 and the second layer 208. In some embodiments, the layer 206 may be an ARC layer and the formation of the first ion implantation 212 may confer a higher etch selectivity of the ARC layer with respect to the second layer 208. In one embodiment, the first ion implantation 212 implants ions through an entire depth of the ARC layer.

Figure 2B:
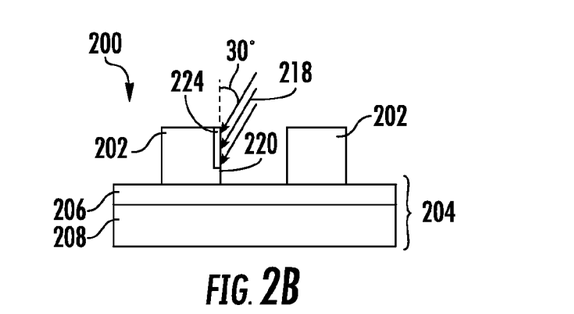
Figure 2C:
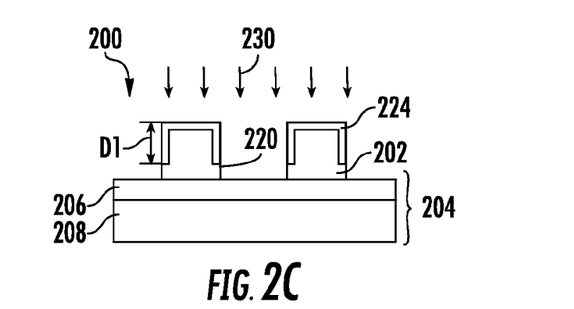
Figure 2D:
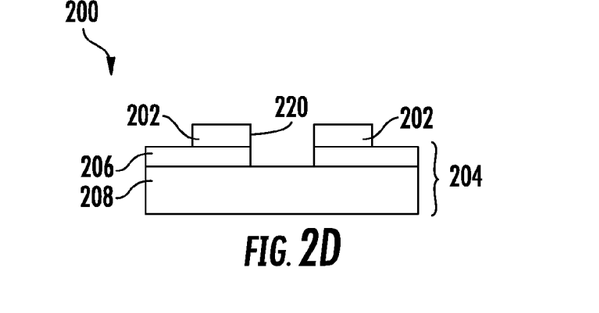

As shown in FIGS. 2B-D, the set of patterning features 202 may be processed generally as described above with respect to FIGS. 1A-C. For example, as shown in FIG. 2B, an ion implantation 218 to the sidewall surface 220 of one or more of the set of patterning features 202 is performed to form a treated layer 224 along the set of patterning features 202. In exemplary embodiments, the ion implantation 218 is performed at an angle nonparallel with the sidewall surface 220, for example, 30 degrees. As shown, ions are implanted at approximately 30° incidence angle relative to the sidewall surface to prevent the formation of nano-scale hardmasks in organic and/or inorganic materials, and work in combination with plasma etch process to further improve LER/LWR.

During operation, the ion implantation 218 may be performed while the device 200 is in a first position, for example as shown in FIG. 2B. Following formation of the treated layer 224 along the sidewall surface 220, the device 200 is rotated (e.g., 180 degrees), and the ion implantation 218 may further form the treated layer 224 along one or more additional surfaces of the set of patterning features 202, for example as shown in FIG. 2C. In exemplary embodiments, treated layer 224 is formed atop the set of patterned features 202, and partially along the sidewall surface 220 to a vertical depth D1, as shown.

The device 200 is then etched using an etch process 230, for example a plasma etch, resulting in the structure of the device 200 shown in FIG. 2D. In exemplary embodiments, the set of patterning features 202 is reduced an amount approximately equal to D1 (FIG. 2C), and the layer 206 between the set of patterning features 202 is removed selective to the second layer 208. As noted above, the layer 206 may correspond to an ARC layer and the second layer 208 to an OPL.

Figure 3A:
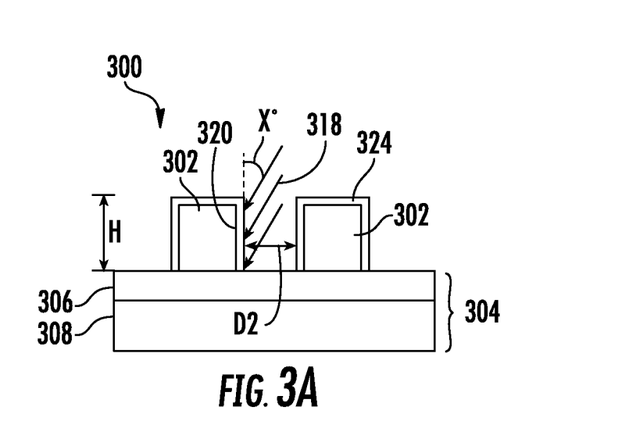
FIGS. 3A-3B depict side cross-sectional views of a method for patterning a semiconductor device in accordance with an embodiment of the present disclosure.
Figure 3B:
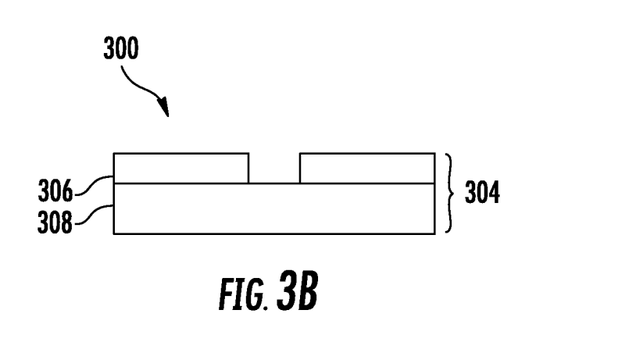

Turning now to FIGS. 3A-B, there is shown cross-sectional views of an approach for patterning a device 300 according to various embodiments of the disclosure. As shown in FIG. 3A, a set of patterning features 302 is disposed upon a substrate 304. Similar to embodiments described above, the substrate 304 may include multiple layers including a layer 306 (e.g., ARC) and a second layer 308 (e.g., OPL). The set of patterning features 302 may be formed from a photoresist.

In this embodiment, corresponding to a directed self-assembly process (DSA), each of the set of patterning features 302 may have a uniform height H across the wafer, as well as a uniform distance D2 between adjacent patterning features. Because the geometries of the set of patterning features 302 lines are constant across the wafer, the set of patterning features 302 may be used to shadow the space between the lines. In one embodiment, the ion incidence angle X for the ion implantation 318 may be chosen in such a way so just the sidewall surfaces 320 are implanted. Meanwhile, the areas of the layer 306 between the set of patterning features 302 are not affected. As such, when using certain species such as Si for the ion implantation 318, the selectivity of the photoresist of the set of patterning features to the layer 306 (e.g., ARC) can be significantly improved, while beneficially eliminating sidewall striation and etch-induced LER.

As shown in FIG. 3A, the ion implantation 318 may form the treated layer 324 atop the set of patterned features 302, as well as along the entire height H of the sidewall surface 320. In this embodiment, the treated layer 324 extends to a top surface of the layer 306.

The device 300 is then etched using an etch process (not shown), for example a plasma etch, resulting in the structure of the device 300 shown in FIG. 3B. In exemplary embodiments, the set of patterning features 302 is removed, and the layer 306 between the set of patterning features 302 is recessed selective to the second layer 308. As noted above, the layer 306 may correspond to an ARC layer and the second layer 308 to an OPL.

Figure 4A:
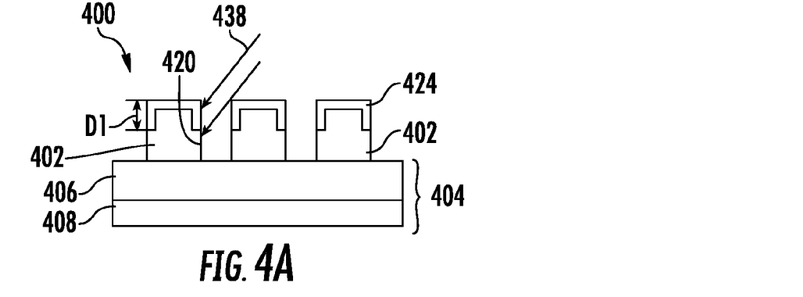
FIGS. 4A-4D depict side cross-sectional views of a method for patterning a semiconductor device in accordance with an embodiment of the present disclosure.

Turning now to FIGS. 4A-D, there is shown cross-sectional views of an approach for patterning a device 400 according to various embodiments of the disclosure. As shown in FIG. 4A, a set of patterning features 402 is disposed upon a substrate 404. Similar to embodiments described above, the substrate 404 may include multiple layers including a layer 406 (e.g., ARC) and a second layer 408 (e.g., OPL). The set of patterning features 402 may be formed from a photoresist.

In this embodiment, multiple implant-etch cycles may be performed for a same layer. For example, during etch transfer of a high aspect-ratio resist pattern into an ARC layer, a first ion implantation may be performed in a way so just a portion of the photoresist is modified for improved etch selectivity and reduced etch striation. The wafer then moves into the etch chamber, to be partially etched. This etch can be end-pointed using the implanted species. The wafer then moves back to the implanter for a second implantation, for example in preparation for a second etch.

More specifically, as shown in FIG. 4A, a first ion implantation 438 is applied to the sidewall surface 420 of one or more of the set of patterning features 402 to form a treated layer 424 along the set of patterning features 402. In exemplary embodiments, the first ion implantation 438 is performed at an angle nonparallel with the sidewall surface 420, for example, 30 degrees. As shown, ions are implanted at approximately 30° incidence angle relative to the sidewall surface 420.

Figure 4B:
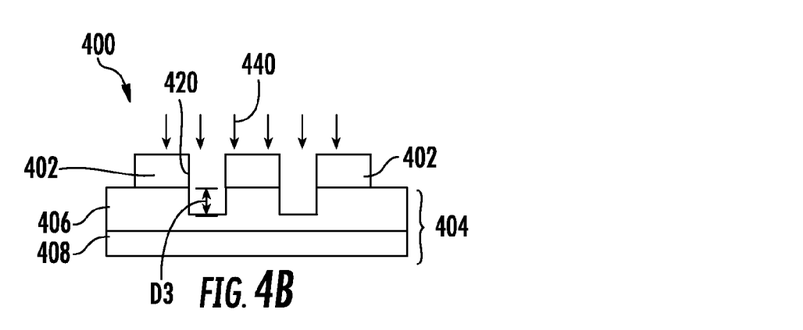

As further shown in FIG. 4A, the first ion implantation 438 may form the treated layer 424 atop the set of patterned features 402, as well as partially along the sidewall surface 420. The device 400 is then etched using an etch process 440, for example a plasma etch, as shown in FIG. 4B, to recess the set of patterning features 402 an amount approximately equal to D1 (FIG. 4A). Additionally, the etch process 440 further recesses the layer 406 between the set of patterning features 402, for example to a depth D3. In this embodiment, D3 extends just partially through a thickness of the layer 406.

Figure 4C:
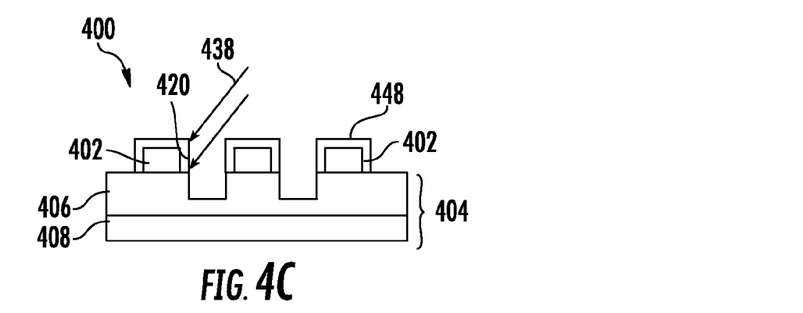

As shown in FIG. 4C, a second ion implantation 444 may then form a second treated layer 448 atop the set of patterned features 402, as well as along a full length of the sidewall surface 420 of the set of patterning features 402. As shown, the second treated layer 448 extends to a top surface of the layer 406.

Figure 4D:
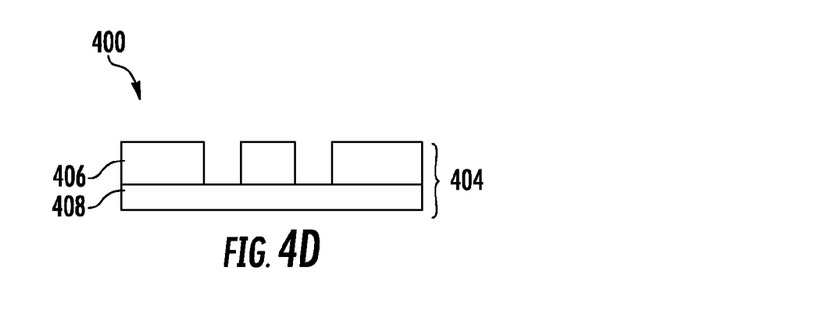

The device 400 is then etched using an etch process (not shown), for example a plasma etch, to form the structure shown in FIG. 4D. In exemplary embodiments, the set of patterning features 402 is removed, and the layer 406 between the set of patterning features 402 is recessed selective to the second layer 408. As noted above, the layer 406 may correspond to an ARC and the second layer 408 to an OPL.

Figure 5:
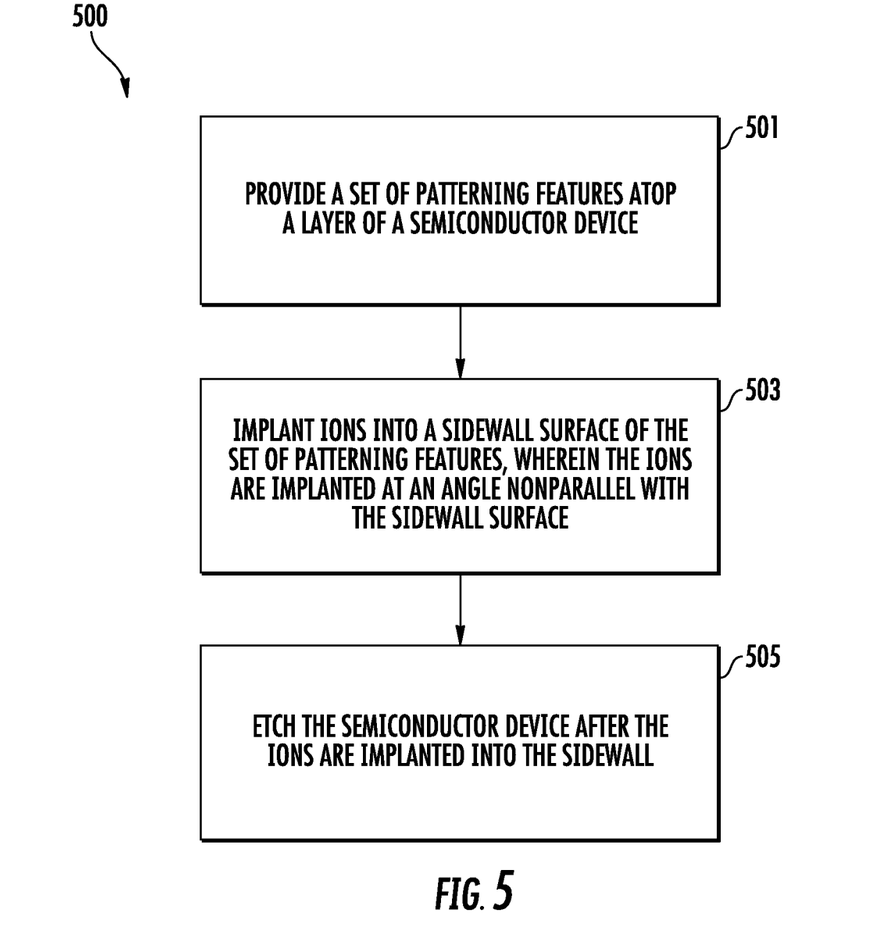
FIG. 5 is a flowchart illustrating an exemplary method according to the present disclosure.

Referring now to FIG. 5, a flow diagram illustrating an exemplary method 500 for patterning a semiconductor device in accordance with the present disclosure is shown. The method 500 will be described in conjunction with the representations shown in FIGS. 1-4.

Method 500 may include providing a set of patterning features atop a layer of a semiconductor device, as shown in block 501. In some embodiments, set of patterning features may have a uniform height. In some embodiments, the set of patterning features are formed from a photoresist.

The method 500 may further include implanting ions into a sidewall surface of the set of patterning features, as shown in block 503. In some embodiments, the ions are implanted at an angle nonparallel with the sidewall surface. In some embodiments, the ions are implanted at an angle nonparallel with the sidewall surface, for example, 30 degrees relative to the sidewall surface. In some embodiments, the ions may be implanted into the layer between each of the set of patterning features. In some embodiments, the ions may be implanted into the layer between each of the set of patterning features at an angle substantially parallel to the sidewall surface. In some embodiments, the ions may be implanted into a sidewall surface of the set of patterning features to form a treated layer along the set of patterning features. In some embodiments, the ions may be implanted into the sidewall surface of the set of patterning features at an angle of 60° relative to a plane normal to the sidewall surface. The implantation angle may vary in other embodiments by +/−15° relative to the plane normal to the sidewall surface. In some embodiments, the ions may be implanted into the sidewall surface of the set of patterning features at an angle relative to the sidewall surface selected to prevent ions from implanting the layer between each of the set of patterning features.

The method 500 may further include etching the semiconductor device after the ions are implanted into the sidewall, as shown in block 505. In some embodiments, the method may include etching the layer between each of the set of patterning features.

In view of the foregoing, at least the following advantages are achieved by the embodiments disclosed herein. Firstly, angling an ion implant directed to a sidewall surface of a patterning feature reduces etch-induced LER originating from sidewall striation. Secondly, etch selectivity with respect to underlying layers disposed under the photoresist is improved, along with photoresist profiles as compared to conventional post-lithography treatments.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method comprising:
   providing a set of patterning features atop a layer of a semiconductor device;
   forming a treated layer atop the set of patterning features and along a sidewall surface of the set of patterning features by implanting ions into a top surface of the set of patterning features and into the sidewall surface of the set of patterning features, wherein the ions are implanted at an angle nonparallel with the sidewall surface to form the treated layer only partially along a vertical depth of the sidewall surface; and
   vertically etching the semiconductor device after the ions are implanted into the sidewall surface to remove the treated layer atop the set of patterning features.

2. The method according to claim 1, further comprising etching the layer between each of the set of patterning features.

3. The method according to claim 1, further comprising implanting ions into the layer between each of the set of patterning features.

4. The method according to claim 3, further comprising implanting ions into the layer between each of the set of patterning features at an angle substantially parallel to the sidewall surface.

5. The method according to claim 1, further comprising implanting ions into the sidewall surface of the set of patterning features at an angle of approximately 60° relative to a plane normal to the sidewall surface.

6. The method according to claim 4, further comprising implanting ions into the sidewall surface of the set of patterning features at an angle relative to the sidewall surface selected to prevent ions from implanting the layer between each of the set of patterning features.

7. The method according to claim 1, wherein each of the set of patterning features has a uniform height.

8. The method according to claim 1, wherein the layer is an anti-reflective coating (ARC) formed atop an organic planarization layer, and wherein the set of patterning features is formed from a photoresist.

9. The method according to claim 8, further comprising implanting ions through an entire depth of the ARC.

10. A method comprising:
    providing a set of patterning features atop an anti-reflective coating (ARC) layer of a semiconductor device, the set of patterning features formed from a photoresist;
    forming a treated layer along a top surface and a sidewall surface of the set of patterning features by implanting ions into the top surface and the sidewall surface of the set of patterning features, the ions implanted into the sidewall surface at an angle formed with the sidewall surface of approximately 60° relative to a plane normal to the sidewall surface to form the treated layer only partially along a vertical depth of the sidewall surface; and
    vertically etching the ARC layer after the ions are implanted into the top surface and the sidewall surface of the set of patterning features to remove the treated layer along the top surface of the set of patterning features.

11. The method according to claim 10, further comprising etching the ARC layer between each of the set of patterning features.

12. The method according to claim 11, further comprising implanting ions into the ARC layer between each of the set of patterning features at an angle substantially parallel to the sidewall surface.

13. The method according to claim 10, further comprising implanting ions into the sidewall surface of the set of patterning features at an angle relative to the sidewall surface selected to prevent ions from implanting the ARC layer between each of the set of patterning features.

14. The method according to claim 10, wherein each of the set of patterning features has a uniform height and a uniform spacing between adjacent patterning features.

15. The method according to claim 10, wherein the ARC layer is formed atop an organic planarization layer (OPL).

16. The method according to claim 15, further comprising:
    performing a second ion implantation to the sidewall surface of the set of patterning features to form a second treated layer along the set of patterning features; and
    etching the semiconductor device to remove the set of patterning features and to etch the ARC layer selective to the OPL.

17. The method according to claim 10, further comprising implanting ions at an implantation energy configured to penetrate an entire depth of the ARC layer.

18. A method for patterning a semiconductor device, the method comprising:
    providing a set of patterning features atop a layer of a semiconductor device, the layer formed atop a second layer;
    forming a first treated layer along a top surface and a sidewall surface of the set of patterning features by performing a first ion implant to the top surface and the sidewall surface of the set of patterning features, the ions implanted into the sidewall surface at an angle formed with the sidewall surface of approximately 60° relative to a plane normal to the sidewall surface;
    vertically etching the semiconductor device to vertically recess the set of patterning features and the layer;
    forming a second treated layer along the top surface and the sidewall surface of the set of patterning features by performing a second ion implant to the top surface and the sidewall surface of the set of patterning features, the ions implanted into the sidewall surface at an angle formed with the sidewall surface of approximately 60° relative to a plane normal to the sidewall surface; and
    vertically etching the semiconductor device to remove the set of patterning features and to recess the layer selective to the second layer.

19. The method according to claim 18, wherein the layer is an anti-reflective coating layer, the second layer is an organic planarization layer, and the set of patterning features are formed from a photoresist.

\* \* \* \* \*